United States Patent
Lee et al.

(10) Patent No.: US 8,982,326 B2
(45) Date of Patent: Mar. 17, 2015

(54) EXPOSURE SYSTEM, METHOD OF FORMING PATTERN USING THE SAME AND METHOD OF MANUFACTURING DISPLAY SUBSTRATE USING THE SAME

(71) Applicant: Samsung Display Co., Ltd., Yongin, Gyeonggi-Do (KR)

(72) Inventors: Jong-Kwang Lee, Daejeon (KR); Min Kang, Seoul (KR); Jin-Ho Ju, Seoul (KR); Bong-Yeon Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 14 days.

(21) Appl. No.: 13/652,911

(22) Filed: Oct. 16, 2012

(65) Prior Publication Data
US 2013/0122428 A1    May 16, 2013

(30) Foreign Application Priority Data
Nov. 16, 2011   (KR) .......................... 10-2011-0119742

(51) Int. Cl.
*G03B 27/72* (2006.01)
*G03F 1/30* (2012.01)
*G03F 7/20* (2006.01)

(52) U.S. Cl.
CPC .............. *G03F 7/70575* (2013.01); *G03F 1/30* (2013.01); *G03F 7/70283* (2013.01)
USPC ................................. 355/71; 430/5

(58) Field of Classification Search
CPC ... G03F 7/70283; G03F 1/36; G03F 7/70191; G03F 7/70291; G03F 1/26; G03F 1/28; G03F 7/70241; G03F 1/30; G03F 1/34; G03F 1/22; G03F 1/38; G03F 1/76; G03F 7/004; G03F 7/70025; G03F 1/144; G03F 7/70208; H01L 21/02678; H01L 21/0274; H01L 21/76825
USPC .................................................. 430/5; 355/71
See application file for complete search history.

(56) References Cited

U.S. PATENT DOCUMENTS

| | | | |
|---|---|---|---|
| 2001/0001693 A1* | 5/2001 | Pierrat et al. ..................... | 430/5 |
| 2006/0244937 A1* | 11/2006 | Nolscher et al. ................. | 355/52 |

FOREIGN PATENT DOCUMENTS

| | | | |
|---|---|---|---|
| JP | 2000039700 A | | 2/2000 |
| JP | 2007219128 | * | 8/2007 |
| JP | 2011013283 A | | 1/2011 |
| KR | 1020020048537 A | | 6/2002 |

* cited by examiner

*Primary Examiner* — Caleen Sullivan
(74) *Attorney, Agent, or Firm* — Cantor Colburn LLP

(57) ABSTRACT

An exposure system includes an exposure apparatus and a phase shift mask. The exposure apparatus emits a multi-wavelength light including a plurality of wavelengths different from each other. The phase shift mask includes a transparent substrate and a light blocking layer. The transparent substrate includes a first surface, and a second surface opposite to the first surface. The multi-wavelength light is incident into the first surface. The transparent substrate further includes a recess which extends from the second surface toward the first surface. The light blocking layer includes a first opening which exposes the second surface of the transparent substrate, and a second opening which is spaced apart from the first opening and exposes the recess of the transparent substrate.

10 Claims, 15 Drawing Sheets

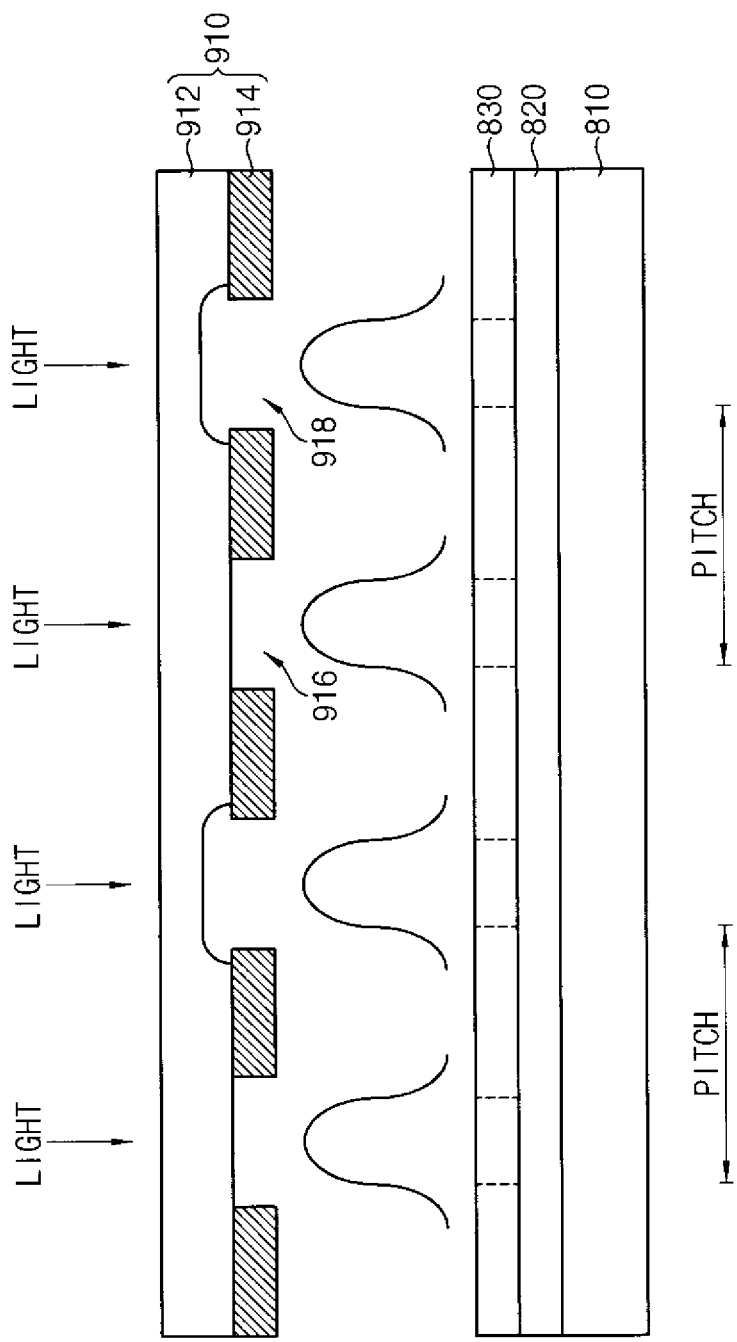

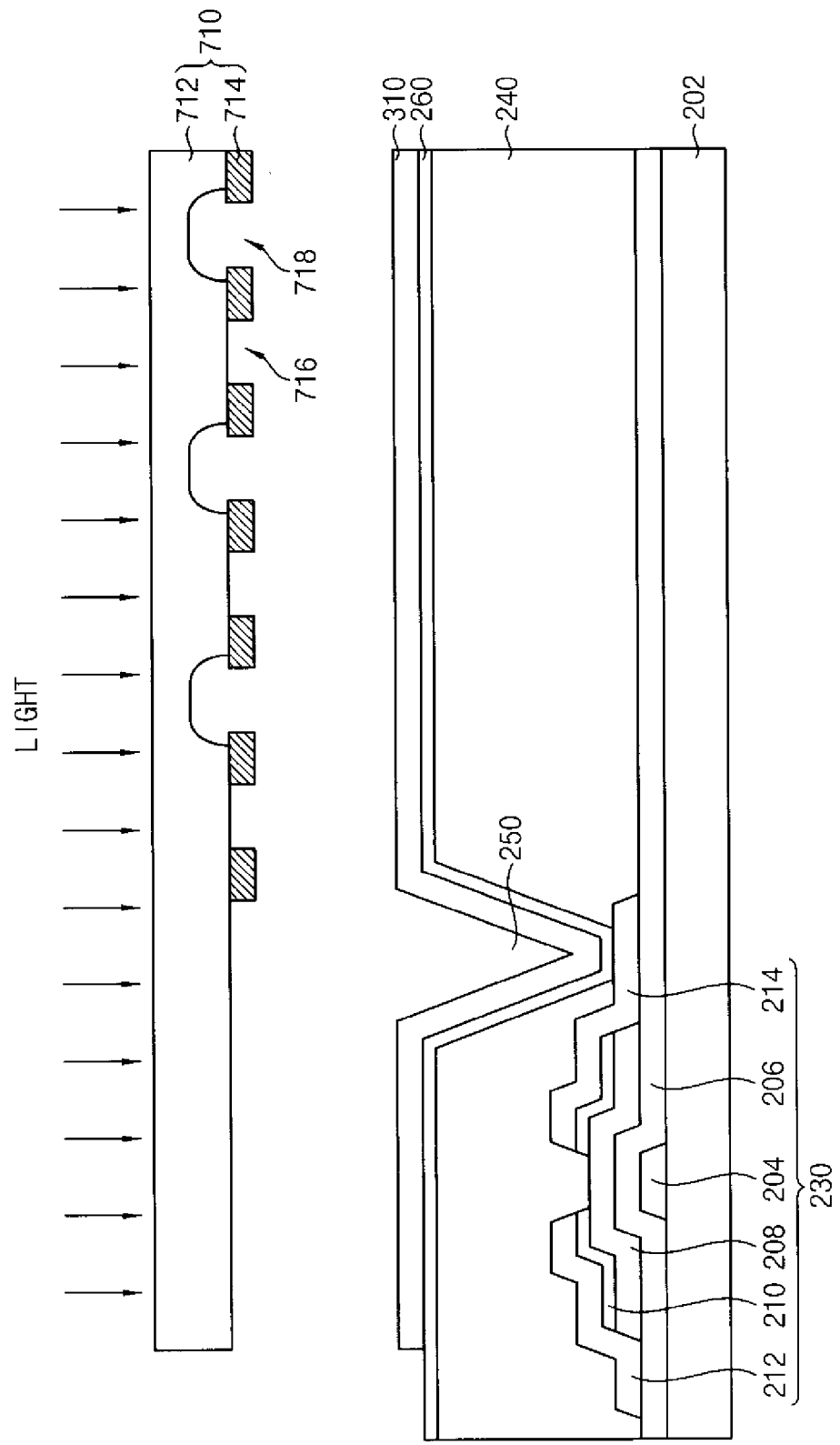

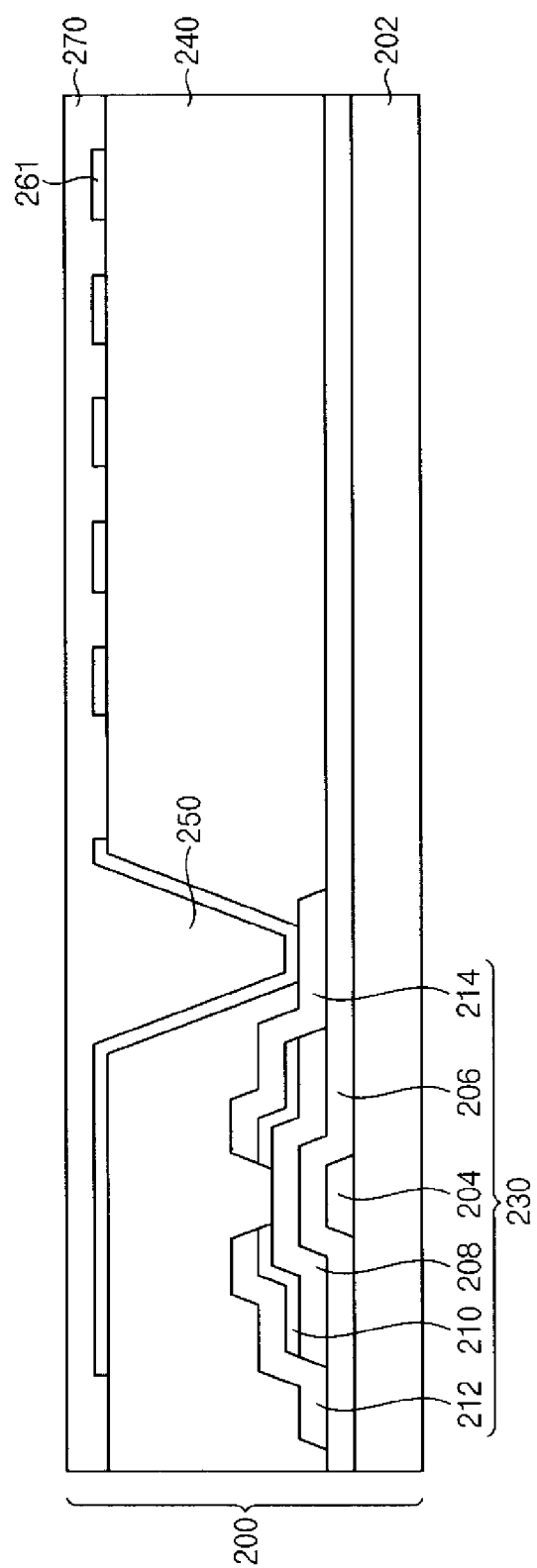

EXPOSURE SYSTEM, METHOD OF FORMING PATTERN USING THE SAME AND METHOD OF MANUFACTURING DISPLAY SUBSTRATE USING THE SAME

This application claims priority to Korean Patent Application No. 10-2011-0119742, filed on Nov. 16, 2011 and all the benefits accruing therefrom under 35 U.S.C. §119, the contents of which are herein incorporated by reference in their entireties.

BACKGROUND OF THE INVENTION

1. Field of the Invention

Exemplary embodiments of the invention relate to an exposure system, a method of forming a pattern using the exposure system, and a method of manufacturing a display substrate using the exposure system. More particularly, embodiments of the invention relate to an exposure system using a multi-wavelength light, a method of forming a pattern using the exposure system, and a method of manufacturing a display substrate of a display panel using the exposure system.

2. Description of the Related Art

A display apparatus such as a liquid crystal display apparatus, an electrophoretic display apparatus and micro electro mechanical system ("MEMS") display apparatus includes a display panel including electronic elements and patterns.

In a process of forming the electronic elements and the patterns on a display substrate of the display panel, a base layer is formed on a substrate and a photoresist is coated on the base layer. A photo mask is disposed on the photoresist and an exposure apparatus irradiates a light onto the photoresist through the photo mask to form a photoresist pattern. The base layer is etched using the photoresist pattern to form the electronic elements and the patterns of the display panel.

The light emitted from the exposure apparatus to manufacture the display apparatus includes multiple wavelengths.

However, it is difficult to form a fine pattern having a small dimension or pitch in a process of manufacturing on the display substrate of the display panel included in the display apparatus due to a resolution of the exposure system emitting the multi-wavelength light.

BRIEF SUMMARY OF THE INVENTION

Exemplary embodiments of the invention provide an exposure system capable of forming a fine pattern, such as for a display panel of a display apparatus.

Exemplary embodiments of the invention also provide a method of forming a fine pattern, such as for a display panel of a display apparatus, using the above-mentioned exposure system.

Exemplary embodiments of the invention also provide a method of manufacturing a display substrate, such as for a display panel, using the above-mentioned exposure system.

According to an exemplary embodiment of the invention, an exposure system includes an exposure apparatus and a phase shift mask. The exposure apparatus emits a multi-wavelength light having a plurality of wavelengths different from each other. The phase shift mask includes a transparent substrate and a light blocking layer. The transparent substrate includes a first surface, and a second surface opposite to the first surface. The multi-wavelength light is incident into the first surface. The transparent substrate further includes a recess which extends from the second surface toward the first surface. The light blocking layer includes a first opening which exposes the second surface of the transparent substrate, and a second opening which is spaced apart from the first opening and exposes the recess of the transparent substrate.

In one embodiment, the recess may have a curved surface at a corner of the recess.

In one embodiment, a depth of the recess may be about 300 nanometers (nm) to about 1050 nm.

In one embodiment, the transparent substrate may include quartz.

In one embodiment, the light blocking layer may include chrome.

In one embodiment, the first opening may transmit a light having a first phase, the second opening may transmit a light having a second phase different from the first phase, and the light having the first phase and the light having the second phase may be blocked by a portion of the light blocking layer between the first opening and the second opening.

In one embodiment, an intensity of a light passing which is transmitted through the portion of the light blocking layer between the first opening and the second opening may be about 0.

In one embodiment, a phase difference between the first phase and the second phase may be about 80 degrees to about 280 degrees.

In one embodiment, the multi-wavelength light may include an I ray having a wavelength of about 365 nm, an H ray having a wavelength of about 405 nm and a G ray having a wavelength of about 436 nm.

In one embodiment, the phase difference may be about 180 degrees.

In one embodiment, a coherence of the multi-wavelength light may be substantially equal to or less than about 0.9.

According to another exemplary embodiment of the invention, there is provided a method of forming a pattern of a display substrate. In the method, a base layer is formed on a substrate. A photoresist layer is formed on the base layer. The photoresist layer is exposed by a multi-wavelength light which is incident to a phase shift mask. The phase shift mask includes a transmission portion in which a first opening exposes a transparent substrate of the phase shift mask and a phase shift portion in which a second opening exposes a recess of the transparent substrate. The exposed photoresist layer is patterned to form a photoresist pattern which corresponds to the transmission portion and the phase shift portion of the phase shift mask. A fine pattern is formed from the base layer using the patterned photoresist pattern.

In one embodiment, a light having a first phase may pass through the transmission portion of the phase shift mask and a light having a second phase different from the first phase may pass through the phase shift portion of the phase shift mask.

In one embodiment, an intensity of the light having the first phase and an intensity of the light having the second phase applied to the photoresist layer may be substantially the same.

In one embodiment, a phase difference between the first phase and the second phase may be between about 80 degrees and about 280 degrees.

In one embodiment, the phase shift mask may further include a light blocking material between the first opening and the second opening, and an intensity of a light irradiated onto the photoresist layer corresponding to the light blocking material may be about 0.

In one embodiment, the transmission portion and the phase shift portion of the phase shift mask may alternate.

In one embodiment, the multi-wavelength light may include an I ray having a wavelength of about 365 nm, an H ray having a wavelength of about 405 nm and a G ray having a wavelength of about 436 nm.

According to still another exemplary embodiment of the invention, there is provided a method of manufacturing a display substrate. In the method, a transistor connected to a gate line and a data line, is formed on a substrate. A transparent conductive layer is formed on the transistor. A photoresist layer is formed on the transparent conductive layer. The photoresist layer is exposed by a multi-wavelength light to a phase shift mask. The phase shift mask includes a transmission portion in which a first opening exposes a transparent substrate of the phase shift mask and a phase shift portion in which a second opening exposes a recess of the transparent substrate. The exposed photoresist layer is patterned to form a photoresist pattern which corresponds to the transmission portion and the phase shift portion of the phase shift mask. A fine electrode pattern is formed from the transparent conductive layer using the patterned photoresist pattern.

In one embodiment, the multi-wavelength light may include an I ray having a wavelength of about 365 nm, an H ray having a wavelength of about 405 nm and a G ray having a wavelength of about 436 nm.

According to the invention, a fine pattern having a pitch substantially equal to or less than about 4 micrometers (μm) may be formed using a multi-wavelength light. Thus, the fine pattern may be formed on a display substrate of a display panel included in a display apparatus.

BRIEF DESCRIPTION OF THE DRAWINGS

The above and other features and advantages of the invention will become more apparent by describing in detailed exemplary embodiments thereof with reference to the accompanying drawings, in which:

FIGS. 9A to 9C are cross-sectional views illustrating an exemplary embodiment of a method of forming a pattern using an exposure system according to the invention; and FIGS. 10A to 10E are cross-sectional views illustrating another exemplary embodiment of a method of manufacturing a display substrate using an exposure system according to the invention.

DETAILED DESCRIPTION OF THE INVENTION

Figure 1:
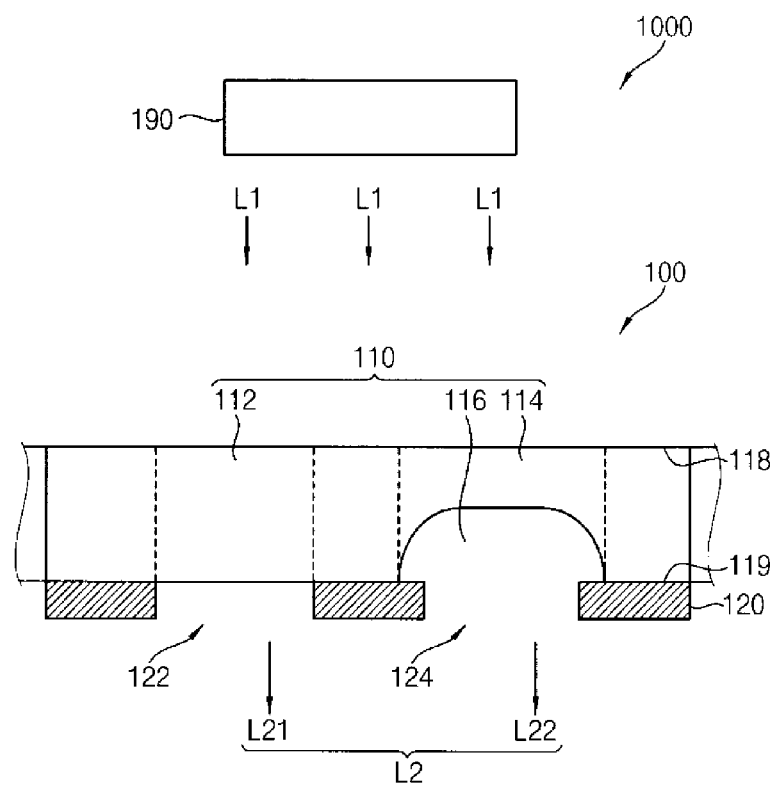
FIG. 1 is a cross-sectional view illustrating an exemplary embodiment of an exposure system according to the invention.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, "connected" includes physically and/or electrically connected. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

FIG. 1 is a cross-sectional view illustrating an exemplary embodiment of an exposure system according to the invention.

Referring to FIG. 1, the exposure system 1000 includes an exposure apparatus 190 and a phase shift mask 100.

The exposure apparatus 190 emits a first light L1. The first light L1 may be a multi-wavelength light including two or more wavelengths different from each other. In one exemplary embodiment, for example, the first light L1 may include an I ray having a wavelength of about 365 nanometers (nm), an H ray having a wavelength of about 405 nm and a G ray having a wavelength of about 436 nm.

The phase shift mask 100 includes a transparent substrate 110 and a light blocking layer 120. The phase shift mask 100 receives the first light L1 and a second light L2 exits the phase shift mask 100. In one exemplary embodiment, for example, the phase shift mask 100 may be a levenson mask which is a kind of an alternating phase shift mask or a strong phase shift mask.

The transparent substrate 110 includes a transmission portion 112 and a phase shift portion 114. The transmission portion 112 and the phase shift portion 114 may be alternately disposed. The transmission portion 112 does not shift a phase of the first light L1 and transmits the first light L1, and the phase shift portion 114 shifts the phase of the first light L. The phase shift portion 114 includes a recess 116 on a second surface 119 opposite to a first surface 118 into which the first light L1 is incident.

The recess 116 may include a curved surface at a corner thereof so as to reduce or effectively prevent a wave guide phenomenon of the first light L1 incident into the transparent substrate 110. Thus, the curved surface at the corner of the recess 116 may reduce or effectively prevent a decrease of an intensity of the first light L1 due to a side surface of the recess 116.

The light blocking layer 120 is on the transparent substrate 110 and the second light L2 exits through the light blocking layer 120. The light blocking layer 120 includes a first opening 122 exposing the transmission portion 112, and the second surface 119 of the transparent substrate 110 overlapping the transmission portion 112. The light blocking layer 120 further includes a second opening 124 spaced apart from the first opening 122 in a first direction (e.g., horizontal in the cross-sectional view of FIG. 1) and exposing the recess 116 of the phase shift portion 114 of the transparent substrate 110.

The second light L2 includes a first element light L21 exiting from the first opening 122 and having a first phase, and a second element light L22 exiting from the second opening 124 and having a second phase different from the first phase. The first element light L21 is a light that the phase of the first light L1 is not shifted, and the second element light L22 is a light that the phase of the first light L1 is shifted as compared with the first element light L21. In one exemplary embodiment, for example, a phase difference between the first element light L21 of the second light L2 and the second element light L22 of the second light L2 may be about 180 degrees(°).

The first opening 122 corresponds to the transmission portion 112 of the transparent substrate 110, and the first element light L21 of the second light L2 exits from the first opening 122. The second opening 124 corresponds to the phase shift portion 114 of the transparent substrate 110, and the second element light L22 of the second light L2 exits from the second opening 124.

In an exemplary embodiment, the transparent substrate 110 of the phase shift mask 100 may include a quartz material, and the light blocking layer 120 may include a chrome material.

Thus, the chrome material may be between the first opening 122 and the second opening 124.

Figure 2:
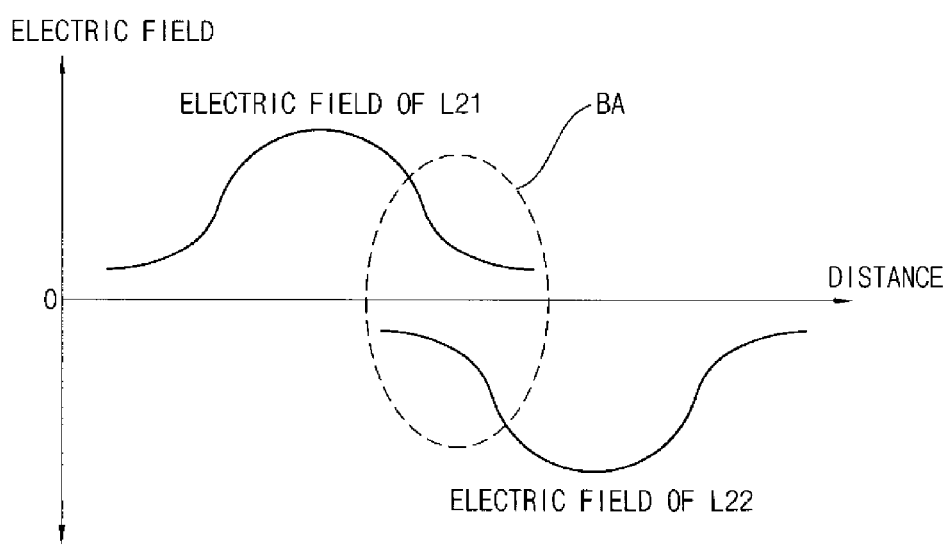
FIG. 2 is a graph illustrating an exemplary embodiment of an electric field of the second light exiting from the phase shift mask of FIG. 1 versus a distance taken along the phase shift mask of FIG. 1.
Figure 3:
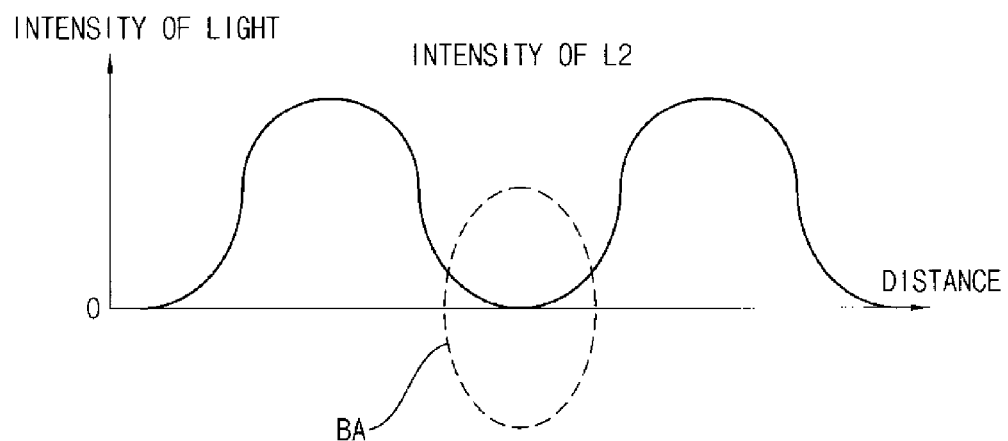
FIG. 3 is a graph illustrating an exemplary embodiment of an intensity of the second light exiting from the phase shift mask of FIG. 1 versus a distance taken along the phase shift mask of FIG. 1.

FIG. 2 is a graph illustrating an electric field of the second light L2 exiting from the phase shift mask 100 of FIG. 1 versus a distance along the first direction of the phase shift mask of FIG. 1, and FIG. 3 is a graph illustrating an intensity of the second light L2 exiting from the phase shift mask 100 of FIG. 1 versus the distance along the first direction of the phase shift mask of FIG. 1.

Referring to FIGS. 1 to 3, an intensity of the first element light L21 of the second light L2 and an intensity of the second element light L22 of the second light L2 are the same, and the phase difference between the first element light L21 and the second element light L22 is about 180 degrees. In addition, the first element light L21 and the second element light L22 overlap each other. The first element light L21 and the second element light L22 are offset from each other at a boundary area BA in which the first element light L21 and the second element light L22 overlap each other. The boundary area BA may correspond to an area between the first opening 122 and the second opening 124 of the light blocking layer 120. Thus, the intensity of the second light L2 may be about 0 at the boundary area BA in which the first opening 122 and the second opening 124 are space apart.

Figure 4:
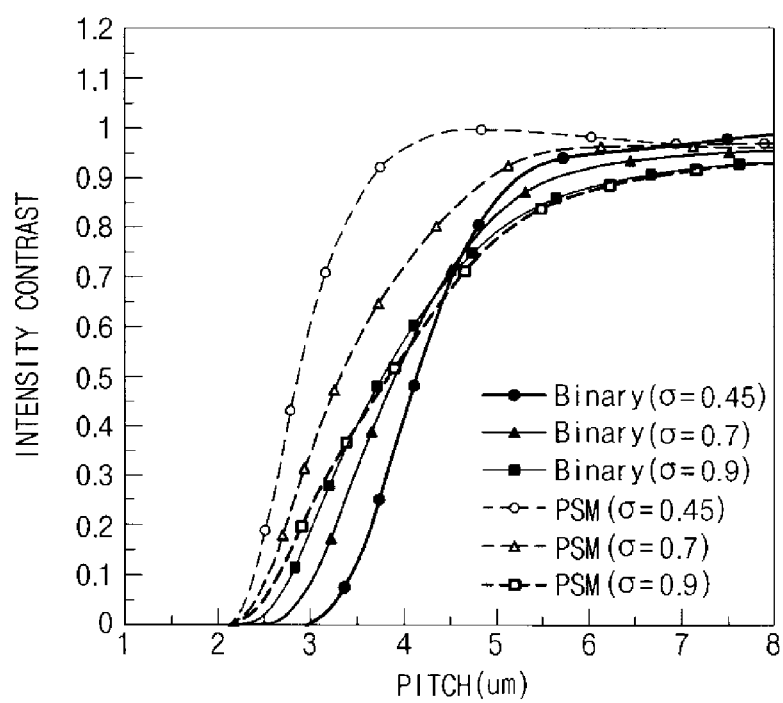
FIG. 4 is a graph illustrating a relationship between coherence of light, resolution expressed as pitch and intensity contrast, of a binary mask and an exemplary embodiment of the phase shift mask according to the invention.

FIG. 4 is a graph illustrating a relationship between coherence ($\sigma$) of light, resolution expressed as pitch in micrometers ($\mu m$) and intensity contrast, of a binary mask and an exemplary embodiment of the phase shift mask (PSM) 100 according to the invention.

Referring to FIGS. 1 and 4, in a process of forming a pattern having a pitch equal to or less than about 3.5 $\mu m$, the coherence of the light exiting from the phase shift mask 100 from the exposure apparatus 190 may be equal to or less than about 0.9 so that the intensity contrast of the phase shift mask 100 is higher than the intensity contrast of the binary mask.

Figure 5A:
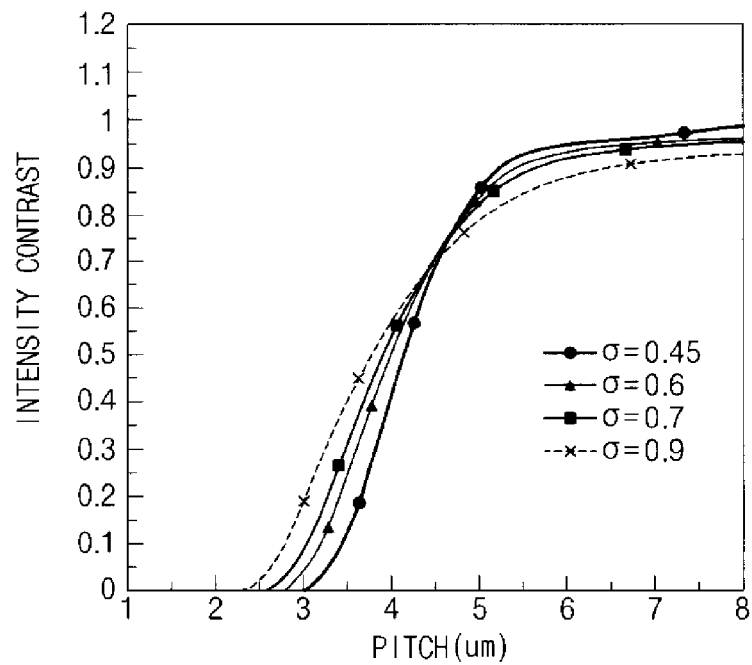
FIG. 5A is a graph illustrating a relationship between coherence of light, resolution expressed as pitch and intensity contrast of a binary mask.
Figure 5B:
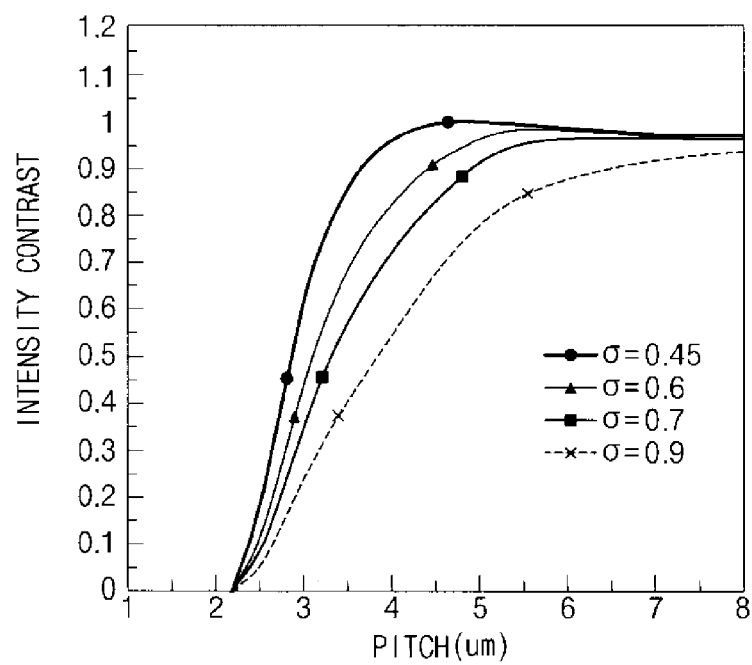
FIG. 5B is a graph illustrating a relationship between coherence of light, resolution expressed as pitch and intensity contrast of an exemplary embodiment of the phase shift mask according to the invention.

FIG. 5A is a graph illustrating a relationship between coherence of light, resolution expressed as pitch and intensity contrast of a binary mask, and FIG. 5B is a graph illustrating a relationship between coherence of light, resolution expressed as pitch and intensity contrast of an exemplary embodiment of the phase shift mask 100 according to the invention.

Referring to FIGS. 1, 5A and 5B, in a process of forming a pattern having a pitch equal to or less than about 4 $\mu m$, the intensity contrast of the binary mask is higher as the coherence of the light increases, however, the intensity contrast of the phase shift mask 100 is higher as the coherence of the light decreases.

Figure 6:
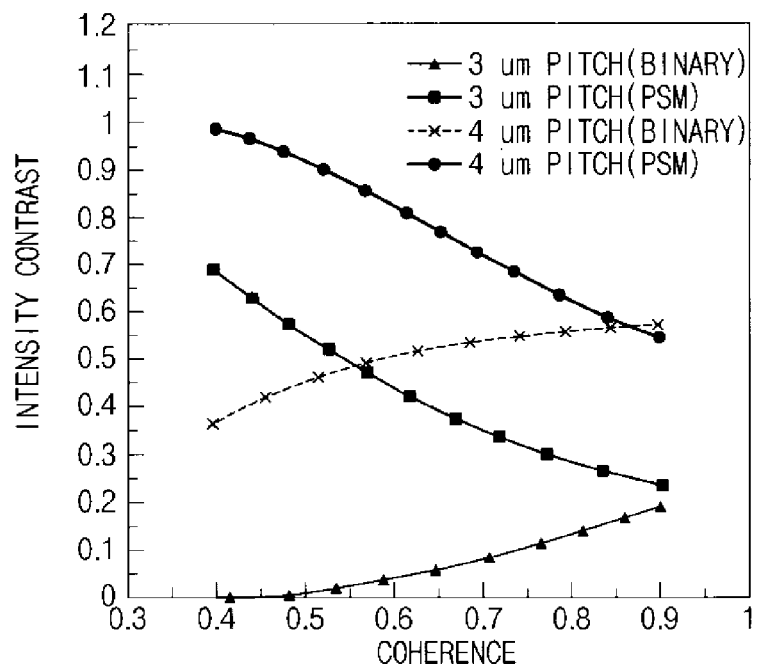
FIG. 6 is a graph illustrating a relationship between resolution expressed as pitch, coherence of light and intensity contrast of a binary mask, and a relationship between resolution expressed as pitch, coherence of light and intensity contrast of an exemplary embodiment of the phase shift mask according to the invention.
Figure 7A:
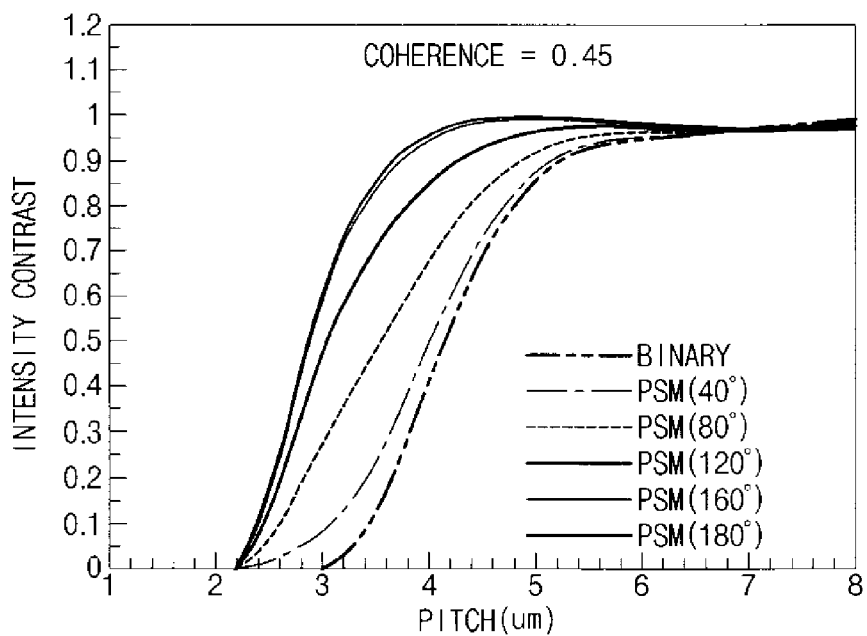
FIGS. 7A to 7F are graphs respectively illustrating a relationship between a coherence of light, resolution expressed as pitch and intensity contrast of a binary mask, and a relationship between the coherence of light, phase shift, resolution expressed as pitch and intensity contrast of an exemplary embodiment of the phase shift mask according to the invention.
Figure 7B:
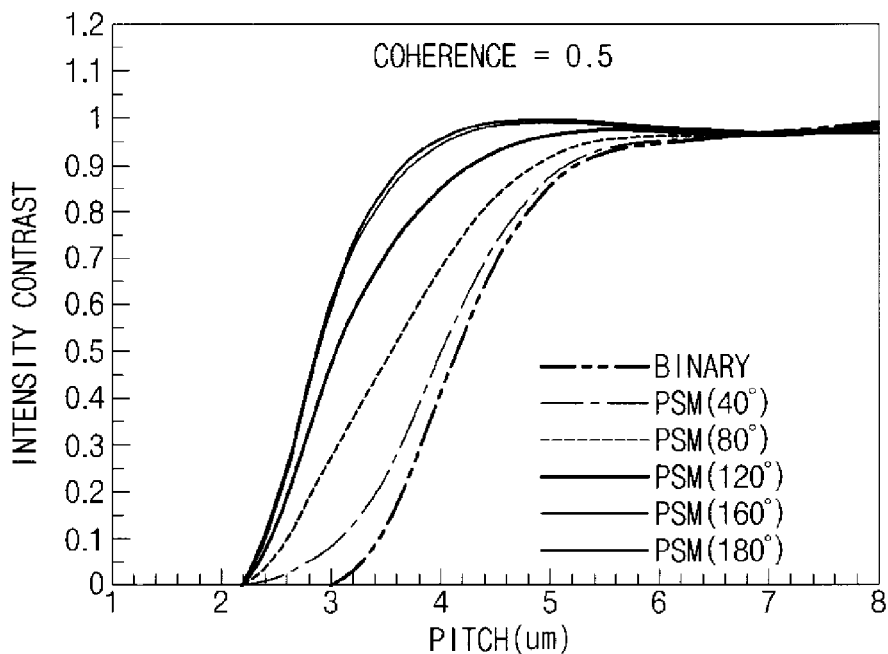
Figure 7C:
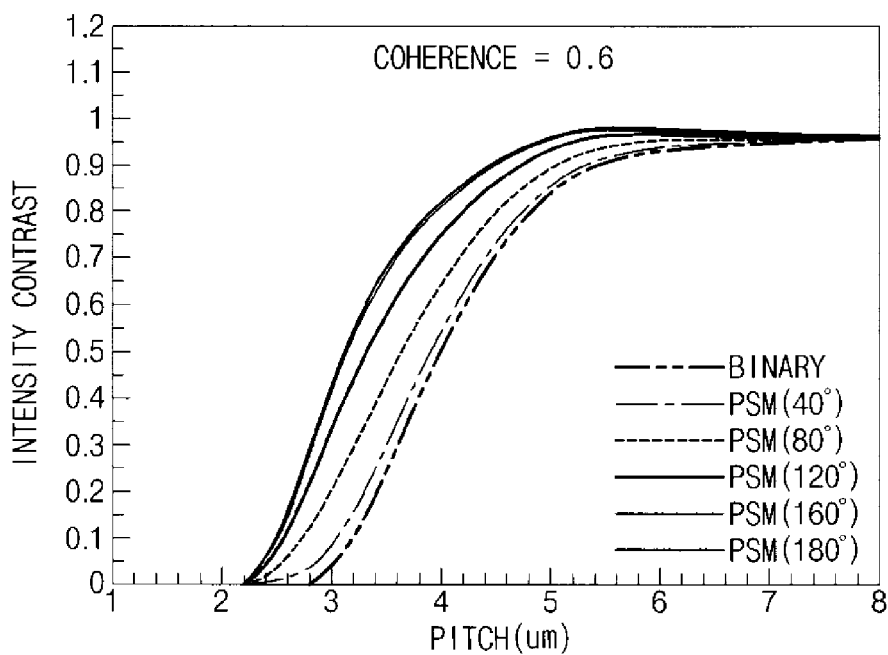
Figure 7D:
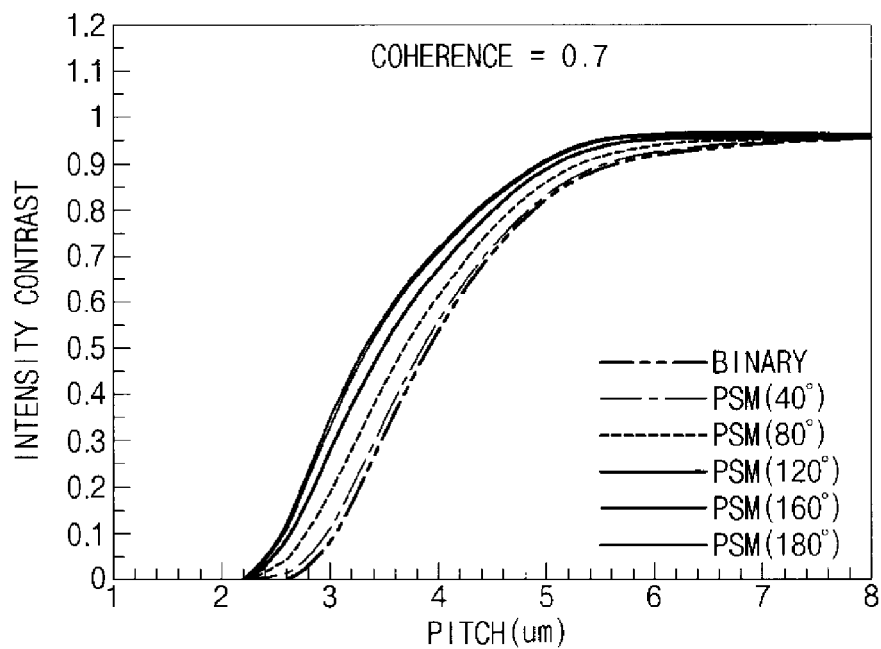
Figure 7E:
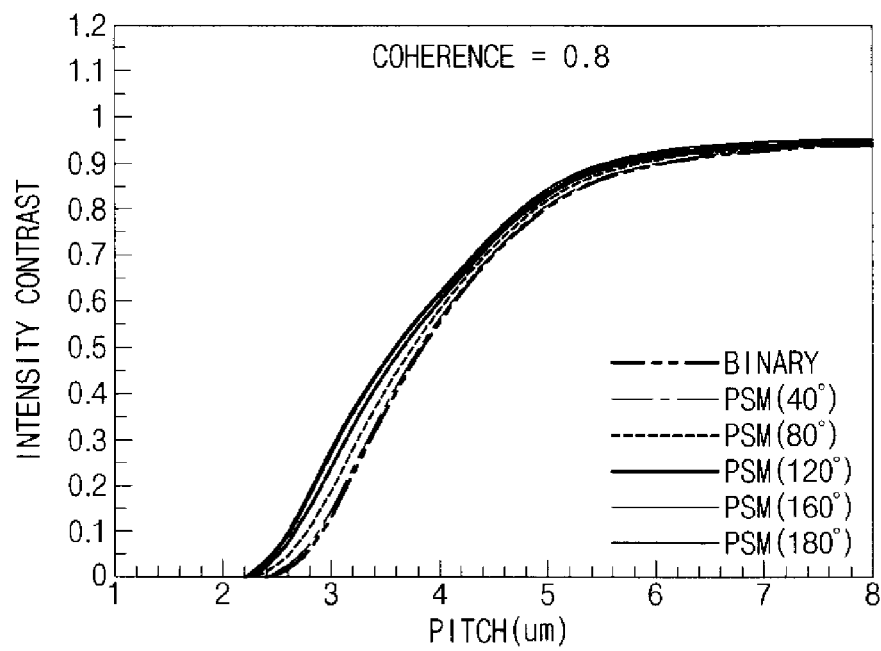
Figure 7F:
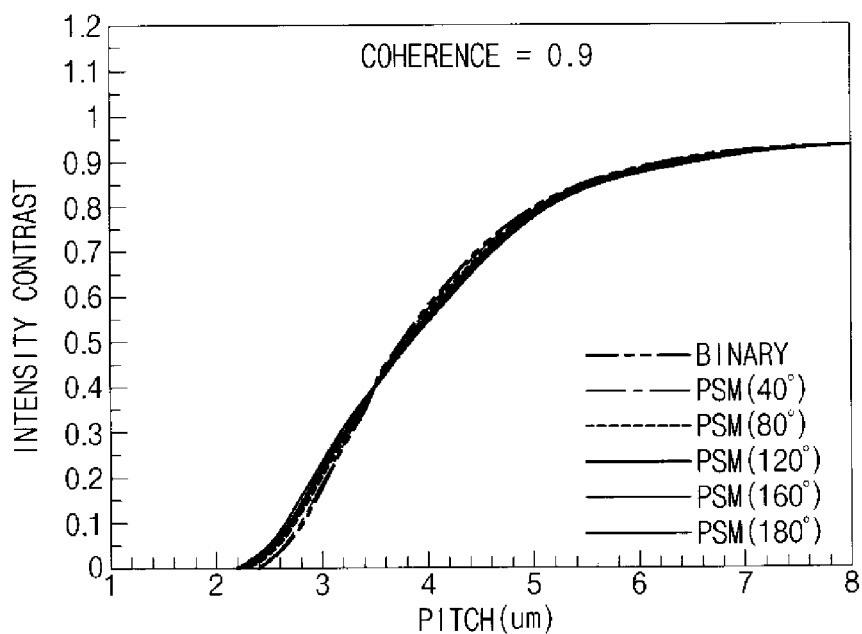

FIG. 6 is a graph illustrating a relationship between resolution expressed as pitch, coherence of light and intensity contrast of a binary mask, and a relationship between resolution, coherence of light and intensity contrast of an exemplary embodiment of the phase shift mask 100 according to the invention.

Referring to FIGS. 1 and 6, in a process of forming a pattern having a pitch equal to or less than about 4 $\mu m$, when the coherence of the light is equal to or less than about 0.85, the intensity contrast of the phase shift mask 100 is higher than the intensity contrast of the binary mask at a respective pitch. In a process of forming a pattern having a pitch equal to or less than about 3 $\mu m$, when the coherence of the light is equal to or less than about 0.9, the intensity contrast of the phase shift mask 100 is higher than the intensity contrast of the binary mask.

FIGS. 7A to 7F are graphs respectively illustrating a relationship between coherence of light, resolution expressed as pitch and intensity contrast of a binary mask, and a relationship between the coherence of light, phase shift in degrees, resolution expressed as pitch and intensity contrast of an exemplary embodiment of the phase shift mask 100 according to the invention.

Referring to FIGS. 1 and 7A to 7F, in a process of forming a pattern having a pitch equal to or less than about 4 μm, at coherences of light of 0.45, 0.5, 0.6, 0.7, 0.8 and 0.9, the intensity contrast of the phase shift mask 100 is higher than the intensity contrast of the binary mask.

In addition, in the process of forming the pattern having the pitch equal to or less than about 4 μm, a difference between the intensity contrast of the binary mask and the intensity contrast of the phase shift mask 100 increases as the coherence of the light decreases from about 0.9.

In addition, in a process of forming a pattern having a pitch equal to or less than about 3.5 μm, when the phase shift of the phase shift mask 100 is about 180 degrees, the difference between the intensity contrast of the binary mask and the intensity contrast of the phase shift mask 100 increases as the coherence of the light decreases from about 0.9.

In addition, when the coherence of the light is equal to or less than about 0.7 and the phase shift of the phase shift mask 100 is equal to or more than about 80 degrees, the intensity contrast of the phase shift mask 100 is higher than the intensity contrast of the binary mask.

Thus, according to the description described with reference to FIGS. 4, 5A, 5B, 6 and 7A to 7F, a coherence of the first light L1 applied to the phase shift mask 100 may be equal to or less than about 0.7 so as to form a pattern having a pitch equal to or less than about 4 μm using the phase shift mask 100 of FIG. 1. In addition, the coherence of the first light L1 applied to the phase shift mask 100 may be equal to or less than about 0.9 so as to form a pattern having a pitch equal to or less than about 3 μm using the phase shift mask 100 of FIG. 1.

Referring to FIGS. 1 and 7A to 7F again, in the process of forming the pattern having the pitch equal to or less than about 3.5 μm, when the phase shift of the phase shift mask 100 is about 180 degrees, the difference between the intensity contrast of the binary mask and the intensity contrast of the phase shift mask 100 increases as the coherence of the light decreases from about 0.9. Thus, the intensity contrast of the phase shift mask 100 is higher as the phase difference of the second light L2 exiting from the phase shift mask 100 is close to about 180 degrees. Thus, the phase difference of the second light L2 exiting from the phase shift mask 100 may be about 180 degrees.

In addition, when the coherence of the light is equal to or less than about 0.7 and the phase shift of the phase shift mask 100 is equal to or more than about 80 degrees, the intensity contrast of the phase shift mask 100 is higher than the intensity contrast of the binary mask. Thus, the phase difference of the second light L2 may be more than about 80 degrees, and for example, the phase difference of the second light L2 may be about 80 degrees to about 280 degrees.

Figure 8:
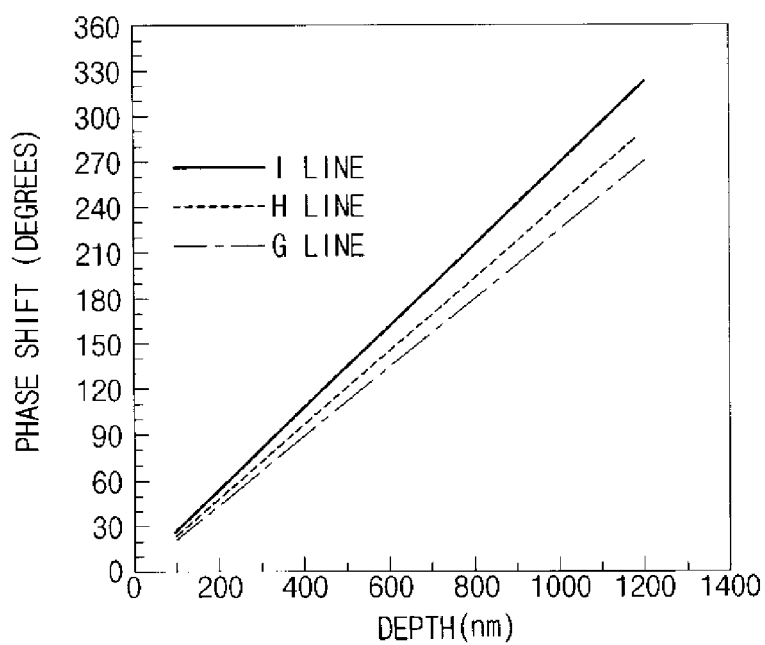
FIG. 8 is a graph illustrating a relationship between depth of a recess of a transparent substrate of a phase shift mask and the phase shift of the second light exiting from the phase shift mask, according to a wavelength of the first light applied to the phase shift mask of FIG. 1.

FIG. 8 is a graph illustrating a relationship between depth in nm of the recess 116 on the transparent substrate 110 and the phase shift in degrees of the second light L2 according to a wavelength of the first light L1 applied to the phase shift mask 100 of FIG. 1.

Referring to FIG. 8, the phase shift of the second light L2 varies according to the wavelength of the first light L1. In one exemplary embodiment, for example, when the second light L2 has the phase shift of about 180 degrees corresponding to the H ray having the wavelength of about 405 nm at a certain depth, the second light L2 may have the phase shift of about 200 degrees corresponding to the I ray having the wavelength of about 365 nm and the second light L2 may have the phase shift of about 170 degrees corresponding to the G ray having the wavelength of the 436 nm at that certain depth.

However, as described with reference to FIGS. 7A to 7F, the phase shift of the second light L2 exiting from the phase shift mask 100 may be about 80 degrees to about 280 degrees. Thus, the phase difference between the first element light L21 and the second element light L22 of the second light L2 may be about 80 degrees to 280 degrees, and may be about 180 degrees corresponding to one of the I ray having the wavelength of about 365 nm, the H ray having the wavelength of about 405 nm and the G ray having the wavelength of about 436 nm.

The depth of the recess 116 on the transparent substrate 110 may be about 300 nm to about 1050 nm so that the second light L2 has the phase shift of about 80 degrees to about 280 degrees corresponding to the I ray having the wavelength of about 365 nm.

According the exemplary embodiment, a fine pattern having a pitch equal to or less than about 4 μm may be formed using the phase shift mask 100 which receives the multi-wavelength first light L1.

Figure 9B:
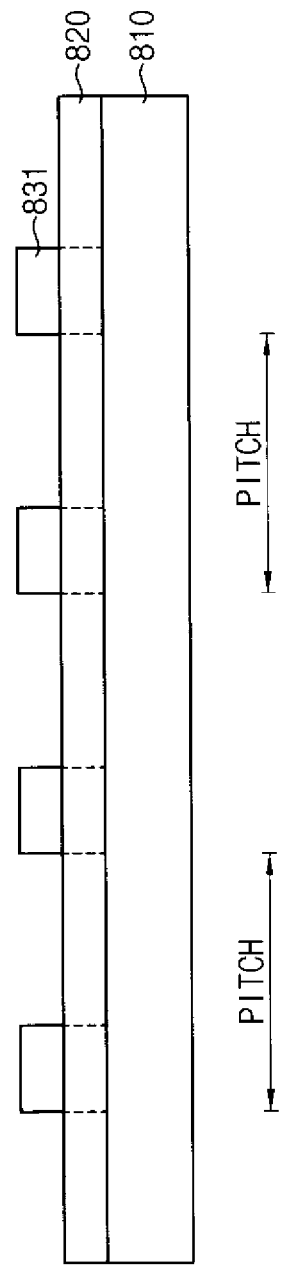
Figure 9C:
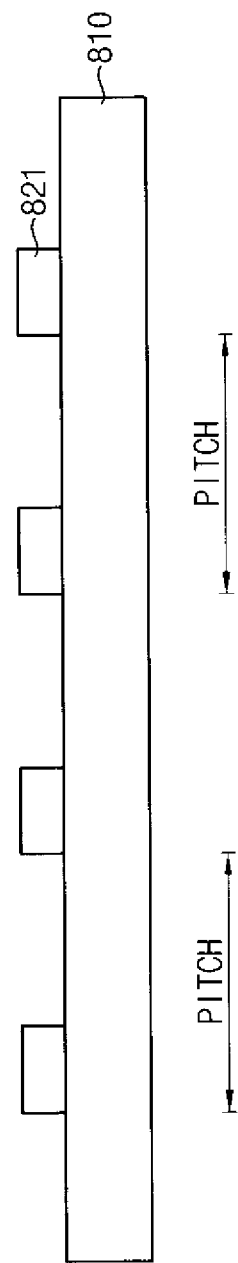

FIGS. 9A to 9C are cross-sectional views illustrating an exemplar embodiment of a method of forming a pattern using an exposure system according to the invention.

Referring to FIG. 9A, a base layer 820 and a photoresist layer 830 are sequentially formed on a substrate 810. In one exemplary embodiment, for example, the substrate 810 may be a glass substrate for forming a display substrate of a display panel, and the base layer 820 may include a conductive material for forming a gate electrode of a thin-film transistor of the display panel.

A phase shift mask 910 is disposed on the substrate 810 on which the photoresist layer 830 is previously formed, and the photoresist layer 830 is exposed by emitting a first light from an exposure apparatus to the phase shift mask 910.

The phase shift mask 910 may be substantially the same as the phase shift mask 100 of FIG. 1. Thus, the phase shift mask 910 includes a transparent substrate 912 and a light blocking layer 914. In addition, the transparent substrate 912 includes a transmission portion which does not shift a phase of the first light and transmits the first light therethrough, and a phase shift portion which shifts the phase of the first light and is alternated with the transmission portion. In addition, the light blocking layer 914 includes a first opening 916 which exposes the transmission portion and a second opening 918 which exposes the phase shift portion.

Thus, a second light exiting from the phase shift mask 910 and incident to the photoresist layer 830 has a phase difference. Light blocking material of the light blocking layer 914 is formed between the first opening 916 and an adjacent second opening 918, and an intensity of the second light applied to the photoresist layer 830 corresponding to the light blocking material may be about 0.

In addition, a first element light of the second light having a first phase and exiting from the first opening 916, and a second element light of the second light having a second phase and exiting from the second opening 918, may be applied to the photoresist layer 830 in the same intensity as illustrated by the intensity of light curves shown in FIG. 9A between the phase shift mask 910 and the photoresist layer 830.

The first light incident into the phase shift mask 910 may include a multi-wavelength light having an I ray including a wavelength of about 365 nm, an H ray having a wavelength of about 405 nm and a G ray having a wavelength of about 436 nm. In addition, a coherence of the first light may be equal to or less than about 0.9. An intensity contrast of the second light exiting from the phase shift mask 910 and incident to the photoresist layer 830 may be higher than a light exiting from a binary mask.

Referring to FIG. 9B, a photoresist pattern 831 is formed in a pattern which corresponds to the transmission portion and the phase shift portion of the transparent substrate 912 of the phase shift mask 910, by respectively exposing photoresist material of the photoresist layer 830 to light transmitted by the first opening 916 and the second opening 918 of the phase shift mask 910.

The intensity contrast of the second light exiting from the phase shift mask 910 to the photoresist layer 830 is higher than that of the light exiting from the binary mask, and thus a pitch of the formed photoresist pattern 831 may be decreased where the phase shift mask 910 is used compared to when the binary mask is used. In one exemplary embodiment, for example, the pitch of the photoresist pattern 831 may be equal to or less than about 4 μm.

Referring to FIG. 9C, the base layer 820 is etched based on the photoresist pattern 831 to form a fine pattern 821. A pitch of the fine pattern 821 may be equal to or less than about 4 μm.

According to the exemplary embodiment, the photoresist pattern 831 having a pitch equal to or less than about 4 μm may be formed using the phase shift mask 910, and thus the fine pattern 821 having a fine pitch may be formed by using the photoresist pattern 831. As described above, the fine pattern 821 may be a gate electrode of a thin-film transistor.

In addition, the fine pattern 821 having the pitch equal to or less than 4 μm may be formed as a pattern on a polarizer of a display panel, using the phase shift mask 910.

FIGS. 10A to 10E are cross-sectional views illustrating another exemplary embodiment of a method of manufacturing a display substrate using an exposure system according to the invention.

Figure 10A:
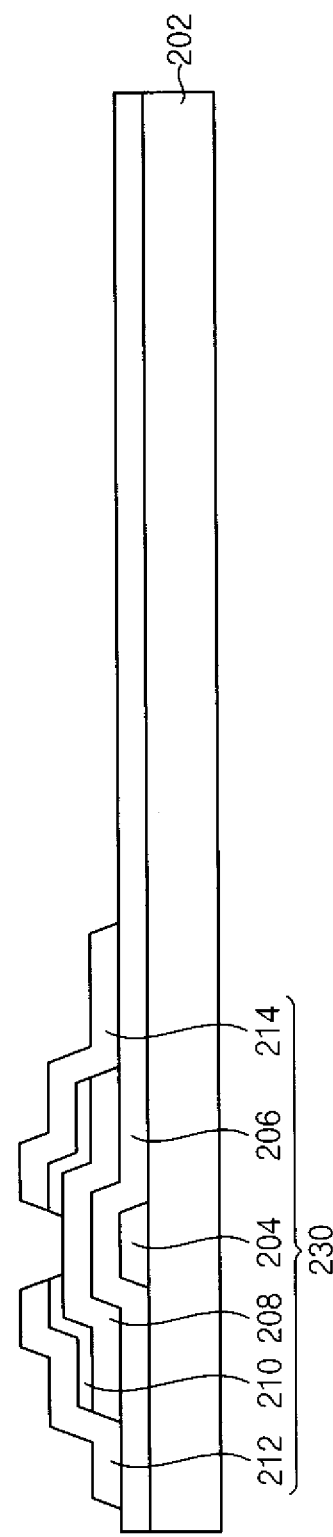

Referring to FIG. 10A, a thin-film transistor 230 is formed on a substrate 202 and is electrically connected with a gate line and a data line of a display panel included in a display apparatus. In one exemplary embodiment, for example, a gate electrode 204 is formed directly on the substrate 202, a gate insulating layer 206 is formed directly on the gate electrode 204, a semiconductor layer including an active layer 208 and an ohmic-contact layer 210 is formed directly on the gate insulating layer 204, and a source electrode 212 and a drain electrode 214 spaced apart from each other are formed directly on the ohmic-contact layer 210, to form the thin-film transistor 230.

Referring to FIG. 10B, an organic insulating layer 240 is formed directly on the thin-film transistor 230, a transparent conductive layer 260 electrically connected with the drain electrode 214 of the thin-film transistor 230 through a contact hole 250 extended through the organic insulating layer 240 is formed directly on the organic insulating layer 240, and a photoresist layer 310 is formed directly on the transparent conductive layer 260.

A phase shift mask 710 is disposed on the substrate 202 on which the photoresist layer 310 is previously formed, and the photoresist layer 310 is exposed by emitting a first light from an exposure apparatus to the phase shift mask 710.

The phase shift mask 710 may be substantially the same as the phase shift mask 100 of FIG. 1. Thus, the phase shift mask 710 includes a transparent substrate 712 and a light blocking layer 714. In addition, the transparent substrate 712 includes a transmission portion which does not shift a phase of the first light and transmits the first light therethrough, a phase shift portion which shifts the phase of the first light is alternated with the transmission portion. In addition, the light blocking layer 714 includes a first opening 716 which exposes the transmission portion and a second opening 718 which exposes the phase shift portion.

Thus, a second light exiting from the phase shift mask 710 and incident to the photoresist layer 310 has a phase difference. Light blocking material of the light blocking layer 714 is formed between the first opening 716 and an adjacent second opening 718, and an intensity of the second light applied to the photoresist layer 310 corresponding to the light blocking material may be about 0.

In addition, a first element light of the second light having a first phase and exiting from the first opening 716, and a second element light of the second light having a second phase and exiting from the second opening 718, may be applied to the photoresist layer 310 in the same intensity.

The first light incident into the phase shift mask 710 may include a plurality of wavelengths including an I ray having a wavelength of about 365 nm, an H ray having a wavelength of about 405 nm and a G ray having a wavelength of about 436 nm. In addition, a coherence of the first light may be equal to or less than about 0.9.

Figure 10C:
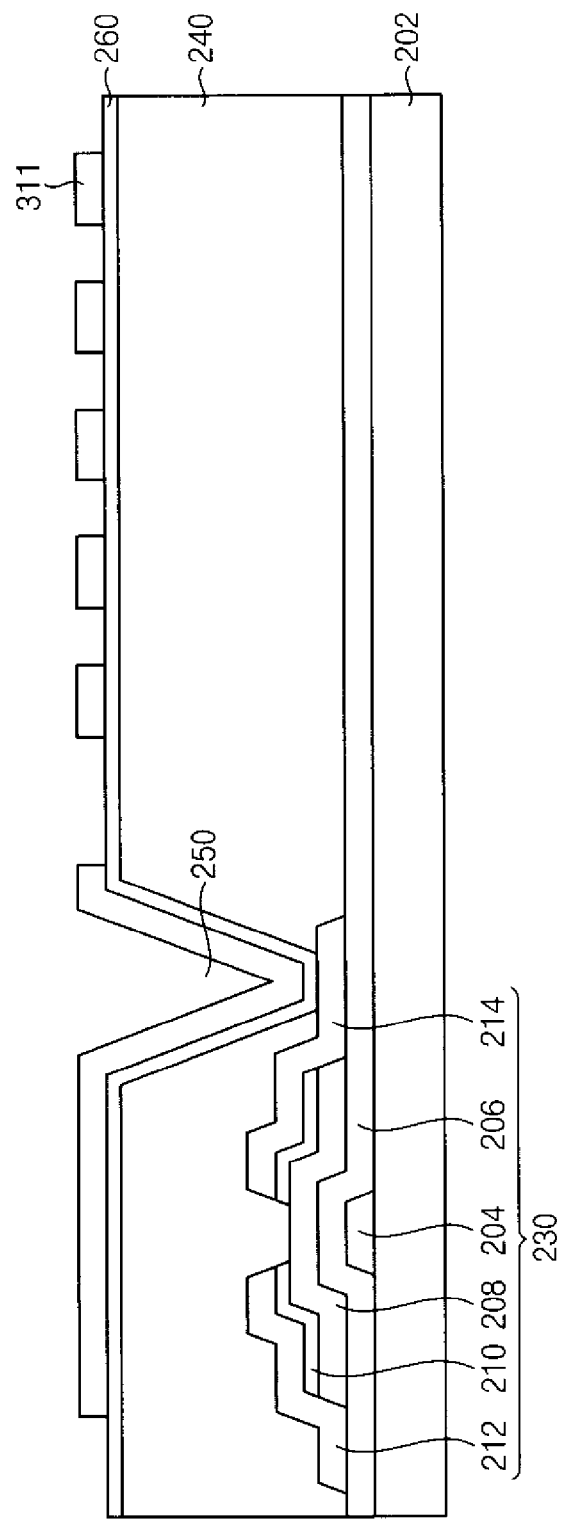

Referring to FIG. 10C, a photoresist pattern 311 is formed in a pattern which corresponds to the transmission portion and the phase shift portion of the transparent substrate 712 of the phase shift mask 710, by respectively exposing photoresist material of the photoresist layer 310 to light transmitted by the first opening 716 and the second opening 718.

The intensity contrast of the second light exiting from the phase shift mask 710 to the photoresist layer 310 is higher than that of the light exiting from the binary mask, and thus a pitch of the photoresist pattern 311 may be decreased where the phase shift mask 710 is used compared to when the binary mask is used. In one exemplary embodiment, for example, the pitch of the photoresist pattern 311 may be equal to or less than about 4 μm.

Figure 10D:
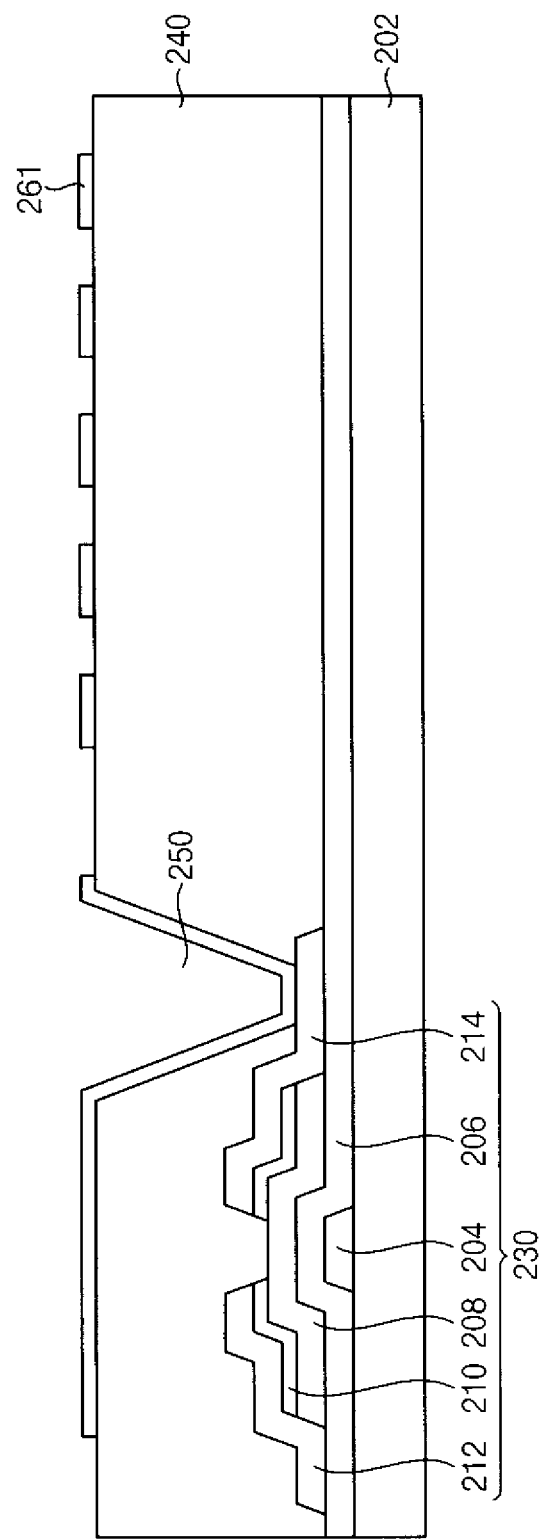

Referring to FIG. 10D, the transparent conductive layer 260 is etched based on the photoresist pattern 311 to form a pixel electrode 261 of the display panel, having a fine electrode pattern. A pitch of the fine electrode pattern pixel electrode 261 may be equal to or less than about 4 μm.

Referring to FIG. 10E, an alignment layer 270 for aligning molecules in a liquid crystal layer of the display panel is formed directly on the pixel electrode 261. Thus, a display substrate 200 of the display panel of a display apparatus is manufactured.

In the exemplary embodiment, the pixel electrode 261 of the display panel, having the fine electrode pattern, is formed using the phase shift mask 710, but it is not limited thereto. In one exemplary embodiment, for example, the gate electrode 204, the active layer 208, the ohmic-contact layer 210, the source electrode 212 and/or the drain electrode 214 of the thin-film transistor 230 of the display panel may be formed using the phase shift mask 710.

According to the exemplary embodiment, the photoresist pattern 311 having a pitch equal to or less than about 4 μm may be formed using the phase shift mask 710, and thus the display substrate 200 including the fine electrode pattern pixel electrode 261 may be formed by using the photoresist pattern 311.

According to the exemplary embodiments of the exposure system, the method of forming the pattern, and the method of manufacturing the display substrate, a fine pattern having a pitch equal to or less than about 4 μm may be formed using a multi-wavelength light. Thus, the fine pattern for electronic elements and other patterned features may be formed on a display substrate of a display panel for a display apparatus.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. An exposure system comprising:
   an exposure apparatus which emits a multi-wavelength light including a plurality of wavelengths different from each other; and
   a phase shift mask including:
      a transparent substrate including a first surface, a second surface opposite to the first surface, and a recess which extends from the second surface toward the first surface, and
      a light blocking layer on the transparent substrate, and including a first opening which exposes the second surface of the transparent substrate, and a second opening which is spaced apart from the first opening and exposes the recess of the transparent substrate,
   wherein the multi-wavelength light is incident into the first surface of the transparent substrate,
   wherein the recess has a curved surface at a corner of the recess,
   wherein the first opening transmits a light having a first phase, and the second opening transmits a light having a second phase different from the first phase, and
   wherein the light having the first phase and the light having the second phase are offset from each other at a boundary area between the first opening and the second opening.

2. The exposure system of claim 1, wherein a depth of the recess is about 300 nanometers to about 1050 nanometers.

3. The exposure system of claim 1, wherein the transparent substrate includes quartz.

4. The exposure system of claim 1, wherein the light blocking layer includes chrome.

5. The exposure system of claim 1, wherein
   the light having the first phase and the light having the second phase are blocked by a portion of the light blocking layer between the first opening and the second opening.

6. The exposure system of claim 5, wherein an intensity of a light which is transmitted through the portion of the light blocking layer between the first opening and the second opening is about 0.

7. The exposure system of claim 5, wherein a phase difference between the first phase and the second phase is about 80 degrees to about 280 degrees.

8. The exposure system of claim 7, wherein the multi-wavelength light includes an I ray having a wavelength of about 365 nanometers, an H ray having a wavelength of about 405 nanometers and a G ray having a wavelength of about 436 nanometers.

9. The exposure system of claim 8, wherein the phase difference is about 180 degrees.

10. The exposure system of claim 1, wherein a coherence of the multi-wavelength light is substantially equal to or less than about 0.9.

* * * * *